United States Patent [19]

Bardens et al.

[11] 4,352,119
[45] Sep. 28, 1982

[54] ELECTRICAL DEVICE AND METHOD FOR PARTICLE ENTRAPMENT DEVICE FOR AN ELECTRICAL COMPONENT

[75] Inventors: William H. Bardens, San Juan Capistrano; Gale C. Nelson, Mira Loma, both of Calif.

[73] Assignee: Beckman Instruments, Inc., Fullerton, Calif.

[21] Appl. No.: 75,864

[22] Filed: Sep. 17, 1979

[51] Int. Cl.³ .................... H01L 23/36; H01L 23/02; H01L 23/12
[52] U.S. Cl. ........................ 357/78; 357/74; 357/72
[58] Field of Search ............... 357/72, 78, 74

[56] References Cited

U.S. PATENT DOCUMENTS

| | | | |
|---|---|---|---|
| 2,902,633 | 9/1959 | Durst | 357/78 |
| 2,928,030 | 3/1960 | Lighty | 357/78 |
| 2,988,676 | 6/1961 | North | 357/78 |
| 3,056,074 | 9/1962 | Fahey et al. | 357/78 |
| 3,528,169 | 9/1970 | Perrin et al. | 357/78 |
| 3,844,992 | 10/1974 | Antonen | 357/72 |
| 4,017,340 | 4/1977 | Yerman | 357/72 |
| 4,042,955 | 8/1977 | Imai et al. | 357/78 |
| 4,096,521 | 6/1978 | Spanjer | 357/72 |

OTHER PUBLICATIONS

Electron Components Conf.; R. F. S. David; IEEE Conf. New York, 1978, Apr. 24 and 26.
RVT Silicone Gel V-120 product Bulletin SWS Silicones Corp.
Information about Electrical/Electronic Material, Dow Corning.

Primary Examiner—Andrew J. James
Attorney, Agent, or Firm—R. J. Steinmeyer; John E. Vanderburgh; F. L. Mehloff

[57] ABSTRACT

An electrical device consisting of a package 10 comprising a base 11 and a lid 15 and an operation element 17 contained within the package. A particle getter 19 is disposed on the lid 15 for entrapping and retaining foreign particles contained within the package 10. A method for protecting the operational element 17 of such an electrical device from the particles is disclosed wherein a polysiloxane material is partially cured with less than about 9 parts of a suitable curing agent to 100 parts of polysiloxane resin to a non-flowing, particle entrapping and retaining condition and the partially cured material is secured within the package.

7 Claims, 1 Drawing Figure

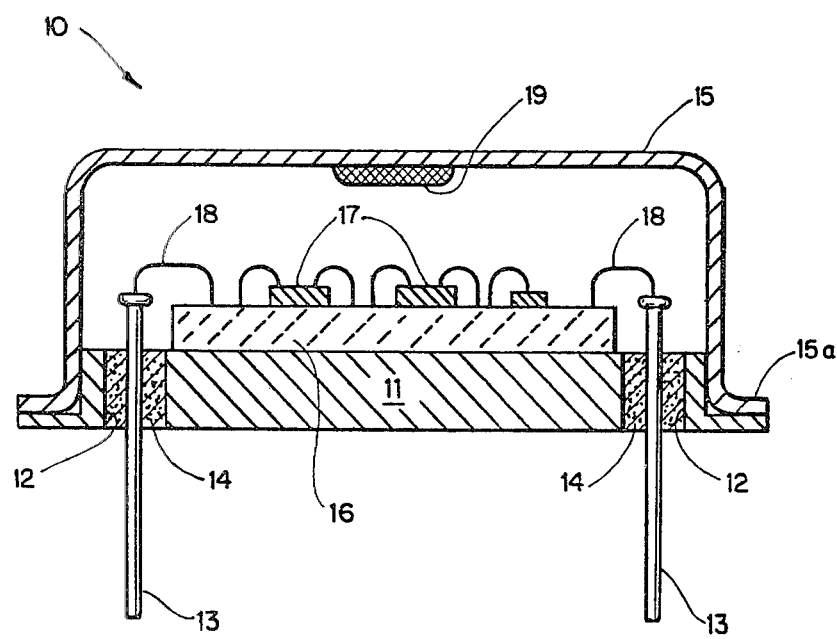

ELECTRICAL DEVICE AND METHOD FOR PARTICLE ENTRAPMENT DEVICE FOR AN ELECTRICAL COMPONENT

BACKGROUND OF THE INVENTION

This invention relates to the manufacture of electrical devices and more particularly to an improved electrical device.

Various types of electrical devices comprise electrical components such as semiconductors, resistors (thick and thin film), hybrid microcircuit devices and the like are disposed within the interior of a protective package or housing, and the interior of the package is normally provided with a suitable inert atmosphere. The package conventionally comprises a base portion and a lid portion, with the functioning electrical components being carried on the base portion and the lid being permanently fastened onto the base by suitable sealing methods such as welding, soldering or adhesives such as epoxy resins and the like.

During the manufacturing process it is often possible for particles to become entrapped in the interior of the package or housing protecting the functioning electrical components. For example, lint particles can sometimes be found in such devices, as well as particles introduced as a result of the sealing operations. Under certain circumstances such particles, which can become mobile within the protective package, can result in shortening the life of the electrical component and, in many cases may result in the complete malfunctioning of the devices. Devices manufactured for the avionics and space industry and for the military normally are subjected to particle impact noise detection (PIND) tests such as represented by MIL-Std 883, Method 2020 under which the device is subjected to impact and agitation and the movement of particles within that package detected. Accordingly, the presence of particles of any type within the interior of the sealed package of an electrical device is considered highly deleterious and can result in a substantial number of rejected units and a substantial increase in the cost per unit for manufacture.

A variety of methods have been proposed and utilized to alleviate the particle problem in devices utilizing sealed packages. For example, great care has been utilized in the processing itself to avoid the production of particles and to reduce the possibility of such particles being in the atmosphere at the time of sealing the package of the device. In certain cases a small resealable opening is provided in the package for removal of particles after manufacture of the electrical device. After removing the particles the opening in the package is resealed. Needless to say, the foregoing methods require extreme care during the manufacturing operations and, in many cases, are ineffective in the prevention of particles within the package of the electrical device.

Other methods involve the coating of the electrically active areas within the device either before or after sealing to immobilize particles which may be trapped therein and to render the circuits electrically immune to the action of conductive particles. Such methods can raise the manufacturing costs substantially and also can result in failures if conductive particles are immobilized in a critical area so as to affect the functioning of the electrical device.

The use of "getter" materials within the interior of the package of an electrical device has been suggested generally for entrapment of moisture and/or various harmful gases. However, North, in U.S. Pat. Nos. 2,988,676 and 2,987,799 suggests the use of a chemically inert material that becomes tacky upon heating for trapping particles immediately following production of a semiconductor device. These materials, however, are generally deficient in that they normally do not have the properties of a particle getter at normal ambient temperatures and such materials are generally not useful over a wide range of temperatures.

It has been reported that experimental investigation has been conducted into the use of high purity cured silicone as a "particle getter" in sealed package electrical devices. R. S. F. David, *Proc. Electron Components Conf.*, Anaheim, Calif., Apr. 24–26, 1978, IEEE, New York (1978). As will be seen, however, fully cured silicone material has not proven successful under the test conditions set out hereinafter.

The present invention overcomes the foregoing deficiencies in sealed package electrical devices with respect to foreign particles.

SUMMARY OF THE INVENTION

In accordance with the present invention a polysiloxane elastomeric "particle getter" material in a partially cured condition is introduced into the package of an electrical device manufactured in accordance with the present invention. The particle getter material serves to entrap and retain foreign particles which may be contained in the package. The particle getter material is partially cured to a substantially nonflowing condition so that it remains in position within the package remote from the functioning electrical component or components of the device and so that it does not interfere with any of the manufacturing operations, particularly the sealing operation. By the same token, the partially cured particle getter material is operative over a wide temperature range to entrap and retain foreign particles.

It should be pointed out that although the words "entrap" and "retain" are utilized in describing the function of the particle getter material, such terms should not be construed as calling out a specific property of the particle getter material of the present invention. Thus, the particle getter material may function as an adhesive trap to hold particles on the surface of the particle getter. The particle getter may also function to entrap particles within the body of the material or the particle getter may function by some other entrapping mechanism.

The present invention is applied to a wide variety of electrical devices which include a sealed package for protection of the functioning electrical components. Thus, for example, the present invention may be utilized in connection with the manufacture of semiconductors, hybrid microcircuits, relays, thin film and thick film resistors, and other similar electrical devices in which the functioning electrical component is disposed in a package or container for protection.

The polysiloxane particle getter material may be selected from a wide variety of organo polysiloxanes which are commercially available. For example, the base resin may comprise polysiloxanes such as dimethyl siloxane, diphenyl siloxane, methyl phenyl siloxane, phenyl vinyl siloxane, tetraethoxy siloxane and the like, and may further include groups such as vinyl groups which aid in the cross linking and curing of the polysiloxane. Organo polysiloxanes often include mixtures of random organo polysiloxanes and block organo polysiloxanes. In addition, the polysiloxane material may include various additives such as quartz, silica, diatomaceous earth and pigments.

The polysiloxane getter material must be capable of operation within an enclosed environment and thus must not during curing or during the useful life of the device, give off any byproducts which would be harmful to the active component of the electrical device. Accordingly, the polysiloxane must be inert with respect to the elements of the electric device and to its function. The composition of the particle getter must also be capable of capturing and retaining foreign particles within the electrical device over a wide range of temperatures. In the present invention it is preferred that the particle getter composition be operative at temperatures ranging from −65° C. to 150° C. Polysiloxanes being relatively heat insensitive have this property when partially cured in accordance with the present invention. In addition to being operable over a wide range of temperatures, it is also highly preferred that the polysiloxane composition retain its particle capturing and retaining properties over a long period of time, at least during the useful life of the electrical device.

As has already been stated, the polysiloxane particle getter composition is partially cured to a nonflowing condition and in this partially cured condition meets the criteria set forth above for the particle getter composition of the present invention. The term "partial cure" as used herein refers to the fact that less than the recommended or theoretical quantity of curing agent is added to the resin to effect the cross-linking thereof and does not refer to curing times or temperatures. In view of the wide variety of polysiloxane resin compositions and curing agents available, a precise ratio of parts of resin to parts of curing agent or percentage of curing agent in the total composition cannot be provided. However, in accordance with the present invention, the particle getter composition in the uncured state must contain at least a sufficient amount of curing agent to provide a finished elastomer composition which is substantially nonflowing in the package of the finished electrical device and which is capable of entrapping and retaining particles but less than that amount of curing agent to complete the cure or cross linking the organo polysiloxane. In the preferred embodiment described hereinafter prior to curing, the organo polysiloxane composition contains less than about 9 parts by weight of curing agent per 100 parts by weight of polysiloxane base resin. Although the polysiloxane functions well to entrap and retain particles throughout a broad range of proportion of curing agent to base resin, it has been found that the uncured polysiloxane is easiest to work with when the curing agent comprises between about 2 parts and about 4 parts per 100 parts of base resin.

Among the curing agents utilized in organo polysiloxane resins are organic peroxides such as, for example, 2,5-bis-(tertiary-butyl peroxy)-2,5-dimethyl hexane and dicumyl peroxide, tert-butyl peroxybenzoate, or benzoyl peroxide; quarternary ammonium salts of strong acids; and alcoholic solutions of platinum such as, for example, a solution of chloroplatinic acid in 2-ethyl hexanol.

In protecting electrical devices in accordance with the present invention the organo polysiloxane material is introduced during manufacture of the device into a package, preferably at a spot within the package which is remote from the operational element or elements of the electrical device. The particle getter material which comprises the reaction product of a mixture of the organo polysiloxane and curing agent is generally in the fully uncured, free flowing condition when placed in the package. Accordingly, the package and getter material are normally subjected to elevated curing temperatures for a sufficient period of time to effect the in situ partial curing of the organo polysiloxane material to render the material substantially nonflowing. This curing step, which serves also to secure the organo polysiloxane within the package, may be carried out before or after sealing the package. In addition, the getter material may be cured prior to its introduction into the package. In such a case, however, normally an additional bonding agent suitable for use within the package will be required to secure the getter material in its place within the package.

If not already sealed, the package is then sealed and subsequently agitated, thereby to cause foreign particles which may be within the package to become mobilized, entrapped and retained in the organo polysiloxane particle getter material.

Other advantages and features of the invention will become apparent from the following description of the preferred embodiments taken in conjunction with the accompanying drawing, which illustrates by way of example the principles of the present invention.

BRIEF DESCRIPTION OF THE DRAWING

The FIGURE is a cross sectional view showing an electrical device incorporating particle getter material in accordance with the present invention.

DESCRIPTION OF THE PREFERRED EMBODIMENT

Referring to the FIGURE, an electrical device produced in accordance with the present invention, is illustrated. The electrical device comprises a package, shown generally as 10, comprising a base or header 11 provided with openings 12 for the extension therethrough of terminal pins 13. The terminal pins 13 are sealed into the openings 12 by glass seals 14. The package is completed by a lid 15 which is provided with an outwardly flaring lip 15a for sealing on the header.

The operational element of the electrical device comprises a substrate 16 which is affixed to the inner surface of the header 11. The header 11 carries an integrated circuit 17 prepared in accordance with standard methods well understood in the art. Wire bonds 18 interconnect the various portions of the integrated circuit 17 and the terminal pins 13.

In accordance with the present invention, a small amount, on the order of about 8 mg, of an organo polysiloxane material is disposed on the inner surface of the lid 15 substantially directly over the integrated circuit 17. As previously described, the organo polysiloxane material is partially cured so that it is substantially nonflowing and thus maintains its position on the underside of the lid 15 and does not creep or flow down on to the integrated circuit or the sealing area between the header and the outwardly flared lip 15a. It is preferred in manufacturing electrical devices in accordance with the present invention to invert the lid and place the drop of particle getter material on the inner surface of the lid. The lid is then subjected to an elevated temperature for sufficient time to complete the partial cure of the organo polysiloxane material. The time and temperature will depend to some extent upon the nature of the organo polysiloxane, the curing agent and the amount of curing agent contained in the uncured mix. After completion of curing, the polysiloxane material is sufficiently nonflowing to maintain its position when the lid is inverted into its normal position on the header. Sealing may be accomplished by welding, soldering or by the use of suitable adhesive material such as the epoxy adhesives. Preferably, sealing is carried out in an inert atmosphere after an appropriate vacuum bake. Alternatively, the package may be evacuated after sealing by providing a resealable opening in the header 11 or the lid 15 and if desired, an inert atmosphere can be introduced into the package 10 prior to resealing.

The invention is further described by the following examples which are illustrative of specific modes of practicing the invention and are not intended as limiting the scope of the invention as defined by the appended claims.

As used throughout this specification all references to parts are parts by weight unless otherwise stated.

EXAMPLE I

The following example demonstrates the effectiveness of an organo polysiloxane particle getter composition containing varying amounts of curing agent.

Samples were prepared which consisted of a ceramic substrate on which an area 0.2 by 0.4 inches was marked out in approximately the center of the substrate. The marked out area was to receive the particle getter composition.

The particle getter composition comprised a methyl phenyl siloxane base resin and a platinum curing agent manufactured by Dow Corning and sold under the trademark "SYLGARD 184". Sixteen particle getter compositions were prepared from the base polysiloxane resin and varying amounts of curing agent. The compositions were prepared in accordance with the following schedule:

| Composition No. | Parts/100 Parts Resin Curing Agent |
| --- | --- |
| 1 | 0 |
| 2 | 1.0 |
| 3 | 2.0 |
| 4 | 3.0 |
| 5 | 4.0 |
| 6 | 5.0 |
| 7 | 6.0 |
| 8 | 7.0 |
| 9 | 8.0 |
| 10 | 9.0 |
| 11 | 9.25 |
| 12 | 9.5 |
| 13 | 9.75 |
| 14 | 10.0 |
| 15 | 11.0 |
| 16 | 12.0 |

Five test devices were prepared for each of the particle getter compositions by placing a sufficient amount of the particle getter composition to provide a substantially uniform coating to cover the marked out area of the ceramic base (about 8 mg). The bases were subjected to heating at 150° C. for one half hour to cure the particle getter composition followed by a vacuum bake at 150° C. for sixteen hours.

Into each of the lids was placed two solder balls (3–10 mil diameter), one piece of aluminum approximately 5 mil diameter by 5 mil long and one piece of gold bond wire, 1 mil diameter by 10–20 mils long to simulate typical deleterious particles which could be found in sealed electrical devices. The devices were assembled, keeping the lids upside down in order to maintain the particles in place and using epoxy as the sealing agent. The units were cured for an additional two hours at approximately 170° C. in order to complete the hardening of the epoxy.

The units were tested for particles using MIL-Std-883, Method 2020 Condition A. This basically comprised subjecting the unit to shock and vibration to determine whether the unit initially contained loose particles, followed by three additional cycles of shock end vibration to determine the amount of time required to trap the particles and to see if the getter material retained the particles. The particles are sensed by attaching the unit being tested to an acoustical transducer and displaying the transducer output. Following the first cycle, the units were subjected to one half hour at 100° C. storage to reduce any static locking of the particles. All of the units were then re-tested as set out above.

The results of the tests indicated that all devices containing getter compositions 1 through 10 proved to be free of loose particles initially or by the end of the first test cycle. All the devices remained free of loose particles during the additional testing cycles. All of the units utilizing compositions 11–16 indicated initially the presence of loose particles. From 2 to 4 units in each group of five utilizing compositions 11–16 indicated failure to trap loose particles at the end of the additional three test cycles and even after three more test cycles. The units indicated the presence of loose particles and thus were considered as failures.

One unit from each of the test groups was opened to determine if all the particles were captured by the particle getter composition. It was noted that in the case of devices utilizing compositions 2–10 that the particles were found to be either embedded in the particle getter composition or trapped on the surface. In the devices utilizing test compositions 11–16, as indicated above, some of the particles had not been captured by the getter composition. In the case of composition No. 1 which had no curing agent the getter material had flowed over the entire inside surface of the ceramic substrate and the lid which was considered undesirable even though captured particles were held in the lid area.

From the foregoing tests it can be seen that the getter composition containing from about 1 to about 9 parts of curing agent per 100 parts of resin exhibited the ability to capture particles and not flow outside of the marked off area of the ceramic base. Getter compositions containing in excess of about 9 parts of curing agent per 100 parts of resin (within the manufacturer's recommended ratio of 10 parts curing agent to 100 parts resin, plus or minus 1 part curing agent) is not as effective in capturing particles. The composition containing no curing agent was considered undesirable in that it flowed beyond the marked off area and, in fact, covered the entire inner surface of the test device. Additional tests were run on devices manufactured as in this Example I, however using soldered joints. The results indicated that the presence of the getter material did not adversely affect the solder joint or materially increase the number of leaking devices over statistical norms for conventionally manufactured devices. The performance of getter material was not adversely affected by the soldering operation.

EXAMPLE II

Test devices were prepared as in Example I using three and one half parts of the curing agent per 100 parts of the polysiloxane composition of Example I. After curing and baking, the units were sealed with epoxy resin as in Example I and tested for initial particles. All units were free of loose particles at the end of the first particle test cycle. The units were then subjected to temperatures of −65° C. for at least 48 hours. The units were then re-tested for the presence of particles while still cold. Out of twenty units one unit exhibited the presence of free particles during the first test cycle but exhibited no evidence of loose particles by the fourth test cycle and remained so for three additional test cycles. The remaining nineteen units tested free of loose particles after the first cycle and remained so after three additional test cycles.

Two of the units were disassembled after completion of the testing and all four of the particles were found to be located in the particle getter composition.

While the foregoing examples utilize a high temperature cure for the particle getter composition, it should be clear that utilizing the proper curing agents and polysiloxane base resin, that curing can occur at room temperature although a longer period of time may be necessary to partially cure the polysiloxane material to a nonflowing condition. By the same token, curing can be speeded up by increasing the curing temperatures. Care should be taken, however, so as not to damage the electrical device by the high temperatures.

While a particular form of the invention has been illustrated and described above, it will be apparent that various modifications can be made without departing from the spirit and scope of the invention.

What is claimed is:

1. An electrical device comprising:
   (a) an operational element for performing an electrical function;
   (b) package means for containing said operational element;
   (c) a particle getter disposed within said package means for entrapping and retaining particles within said package means, said particles getter comprising the reaction product of an organo polysiloxane resin and an effective amount of a curing agent to partially cure said organo polysiloxane material to a substantially non-flow, particle entrapping and retaining condition.

2. The electrical device of claim 1 wherein said particle getter is secured in said package means remote from said operational element.

3. The electrical device of claim 1 wherein said organo polysiloxane resin is selected from the group consisting of dimethyl siloxane, diphenyl siloxane, methyl phenyl siloxane, phenyl vinyl siloxane, tetraethoxy siloxane and mixtures thereof.

4. The electrical device of claim 1 wherein said curing agent is present in amounts up to about 9 parts per 100 parts of said organo polysiloxane resin in the uncured state.

5. The electrical device of claim 1 wherein said curing agent is present in amounts of between about 2 parts and about 4 parts of said organo polysiloxane resin in the uncured state.

6. The device of claim 1 wherein said organo polysiloxane resin is methyl phenyl siloxane.

7. The device of claim 1 wherein said operation element is selected from the group consisting of semiconductors, hybrid microcircuits, relays, thin film resistors and thick film resistors.

* * * * *